US012319385B2

(12) United States Patent
Higley et al.

(10) Patent No.: US 12,319,385 B2
(45) Date of Patent: Jun. 3, 2025

(54) PROCESS FOR ESTABLISHING UNIFORM LIQUID FILMS ON POLAR AND NON-POLAR SUBSTRATES

(71) Applicants: NUtech Ventures, Lincoln, NE (US); Montana State University, Bozeman, MT (US)

(72) Inventors: Leon G. Higley, Lincoln, NE (US); Robert K. D. Peterson, Bozeman, MT (US)

(73) Assignees: Montana State University, Bozeman, MT (US); Board of Regents of the University of Nebraska, Lincoln, NE (US)

( * ) Notice: Subject to any disclaimer, the term of this patent is extended or adjusted under 35 U.S.C. 154(b) by 389 days.

(21) Appl. No.: 17/663,001

(22) Filed: May 11, 2022

(65) Prior Publication Data

US 2022/0363343 A1    Nov. 17, 2022

Related U.S. Application Data

(60) Provisional application No. 63/187,817, filed on May 12, 2021.

(51) Int. Cl.
  *B63B 1/36*        (2006.01)
  *B41F 13/22*       (2006.01)
  (Continued)

(52) U.S. Cl.
  CPC ............... *B63B 1/36* (2013.01); *B41F 13/22* (2013.01); *B81B 1/006* (2013.01); *F16C 19/00* (2013.01);
  (Continued)

(58) Field of Classification Search
  CPC .. B41F 13/08; B41F 13/22; B63B 1/36; B81B 1/006; B81B 2201/058;
  (Continued)

(56) References Cited

U.S. PATENT DOCUMENTS 8,859,090 B2  10/2014  Angelescu et al.
10,876,193 B2  12/2020  Guo et al.

FOREIGN PATENT DOCUMENTS

EP    2806466 B1    9/2016
JP    H11508611 A * 7/1999
JP    2008028164 A   2/2008

OTHER PUBLICATIONS

Chen et al., "Experimental investigation and visualization on capillary and boiling limits of micro-grooves made by different processes," Sensors and actuators A: Physical, 139 (1-2) pp. 78-87 (2007).
Feng et al., "Design and Creation of Superwetting/Antiwetting Surfaces," Advanced Materials, 18 (23) pp. 3063-3078 (2006).
Murakami et al., "Wetting transition from the Cassie-Baxter state to the Wenzel state on textured polymer surfaces," Langmuir, 30 (8) pp. 2061-2067 (2014).
Seiwert et al., "Coating of a textured solid," Journal of Fluid Mechanics, 669 pp. 55-63 (2011).
(Continued)

*Primary Examiner* — Lawrence D Ferguson
(74) *Attorney, Agent, or Firm* — Klarquist Sparkman, LLP

(57) ABSTRACT

Wettable structures that retain liquid layers are defined at surfaces of substrates. The wettable structures include grooves or ridges that are spaced apart by between 10 nm and 10 μm and can be defined in substrate or in a layer formed on a surface of the substrate. In typical examples, wettable structures are defined with hydrophobic materials or at hydrophobic surfaces and produce hydrophilic surfaces.

21 Claims, 15 Drawing Sheets

(51) Int. Cl.
 B81B 1/00 (2006.01)
 F16C 19/00 (2006.01)
(52) U.S. Cl.
 CPC . *B81B 2201/058* (2013.01); *B81B 2203/0323* (2013.01); *F16C 2240/54* (2013.01)
(58) Field of Classification Search
 CPC .. B81B 2203/0323; F16C 19/00; F16C 19/06; F16C 2202/64; F16C 2202/66; F16C 2223/02; F16C 2223/30; F16C 2240/42; F16C 2240/44; F16C 2240/54; F16C 2300/02; F16C 33/585; F16C 33/64; F16C 33/6651
 See application file for complete search history.

(56) References Cited

OTHER PUBLICATIONS

Wilke et al., "Turning traditionally nonwetting surfaces wetting for even ultra-high surface energy liquids," Proceedings of the National Academy of Sciences, 119 (4) 7 pp. (2022).
Xiao et al., "Modeling the Effects of Nanopatterned Surfaces on Wetting States of Droplets," Nanoscale Research Letters, 12 (1) pp. 1-9 (2017).
International Search Report and Written Opinion dated Oct. 7, 2022, from International Patent Application No. PCT/US2022/028753, 13 pp.

* cited by examiner

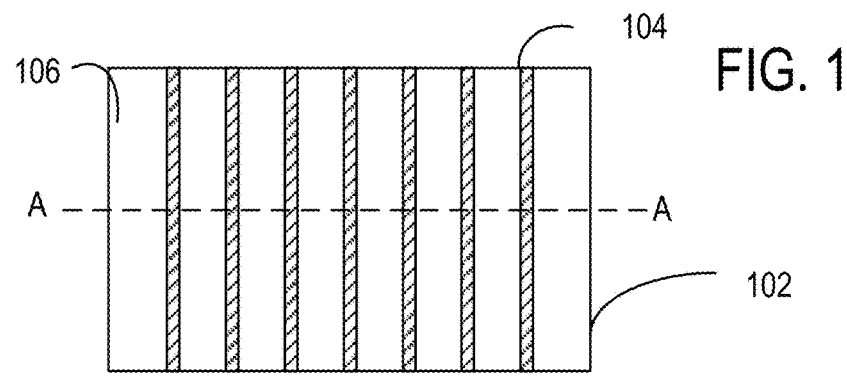
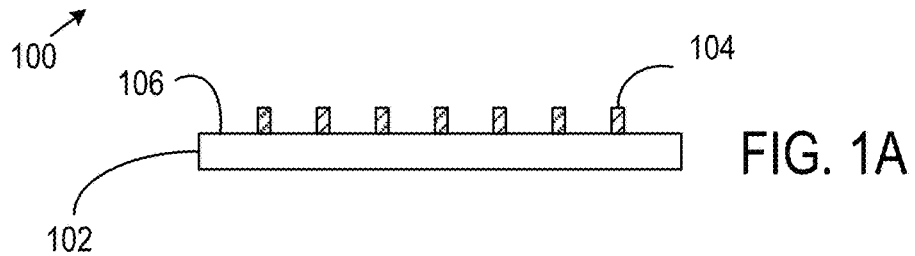
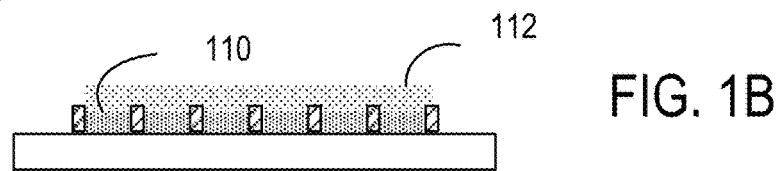
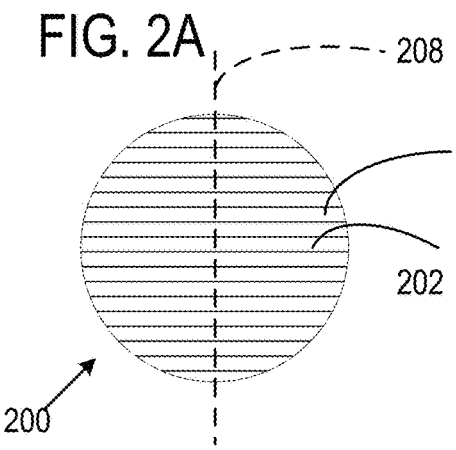
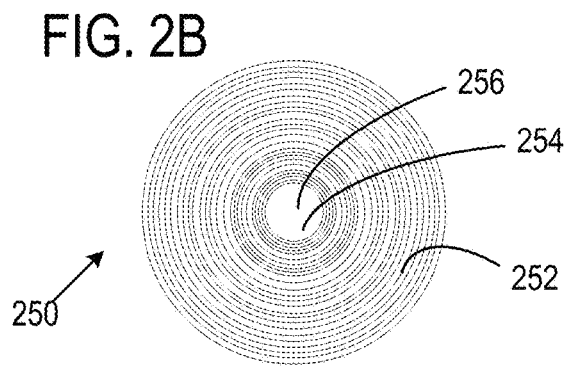
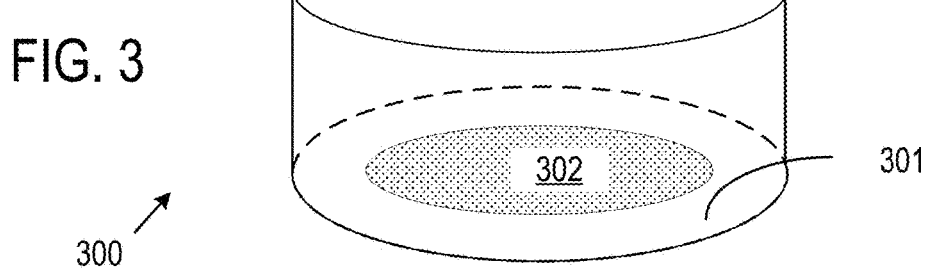

| | Nominal Width | Total Area | After BOE Dip Nominal Etch Depth [um] | | | | |
|---|---|---|---|---|---|---|---|
| | | | 0.5 | 0.7 | 2 | 3.9 | 5.8 |
| A | 1.2 | 1 cm x 1 cm | | | | | |
| B | 1 | 1 cm x 1 cm | | 1 | | 2 | |
| C | 0.8 | 1 cm x 1 cm | | | | | |
| D | 2 | 1 cm x 1 cm | | | | | |
| E | 4 | 1 cm x 1 cm | | 0 | | | |
| F | 6 | 1 cm x 1 cm | | | | | |
| G | 8 | 1 cm x 1 cm | | | | | |
| H | 10 | 1 cm x 1 cm | | | | | |
| I | 1.2 | 1 cm diameter | | | | | |
| J | 1 | 1 cm diameter | | 1 | | 2 | |
| K | 0.8 | 1 cm diameter | | | | | |
| L | 2 | 1 cm diameter | | | | | |
| M | 4 | 1 cm diameter | | 0 | | | |
| N | 6 | 1 cm diameter | | | | | |
| O | 1.2 | 1 cm diameter | | | | | |
| P | 10 | 1 cm diameter | | | | | |

| After HMDS Oven | | | | | | |
|---|---|---|---|---|---|---|
| | | Nominal Etch Depth [um] | | | | |
| | Nominal Width | Total Area | 0.5 | 0.7 | 2 | 3.9 | 5.8 |
| A | 1.2 | 1 cm x 1 cm | | 1 | | 2 | |
| B | 1 | 1 cm x 1 cm | | | | | |
| C | 0.8 | 1 cm x 1 cm | | | | | |
| D | 2 | 1 cm x 1 cm | | | | | |
| E | 4 | 1 cm x 1 cm | 0 | | | | |
| F | 6 | 1 cm x 1 cm | | | | | |
| G | 8 | 1 cm x 1 cm | | | | | |
| H | 10 | 1 cm x 1 cm | | | | | |
| I | 1.2 | 1 cm diameter | | | | | |
| J | 1 | 1 cm diameter | | 1 | | 2 | |
| K | 0.8 | 1 cm diameter | | | | | |
| L | 2 | 1 cm diameter | | | | | |
| M | 4 | 1 cm diameter | 0 | | | | |
| N | 6 | 1 cm diameter | | | | | |
| O | 1.2 | 1 cm diameter | | | | | |
| P | 10 | 1 cm diameter | | | | | |

FIG. 14C

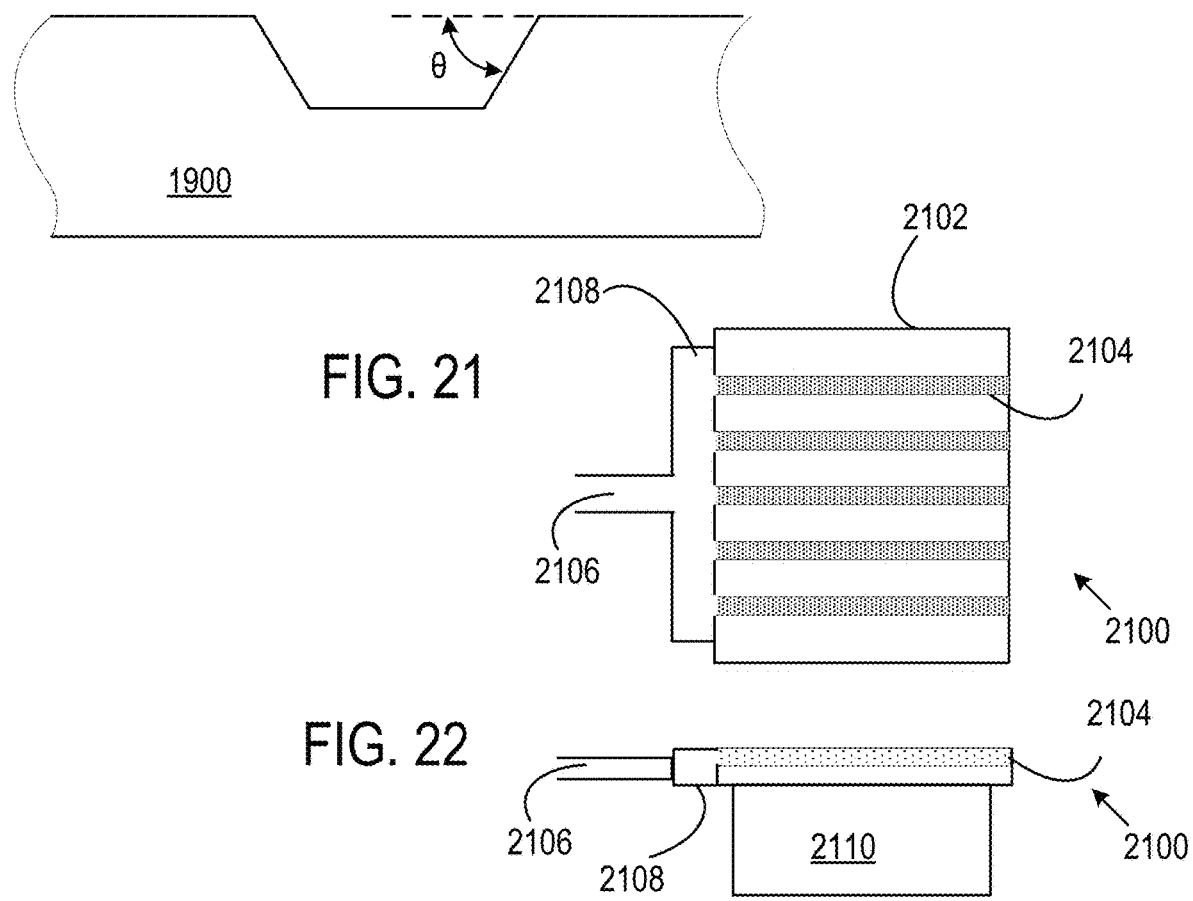

PROCESS FOR ESTABLISHING UNIFORM LIQUID FILMS ON POLAR AND NON-POLAR SUBSTRATES

CROSS REFERENCE TO RELATED APPLICATION

This application claims the benefit of U.S. Provisional Patent Application No. 63/187,817, filed on May 12, 2021, which is incorporated herein by reference in its entirety.

FIELD

The disclosure pertains to surfaces having wettability based on surface structure.

BACKGROUND

Wetting is the ability of a liquid to maintain contact with a solid surface, resulting from intermolecular interactions when the two are brought together. The degree of wetting (wettability) is determined by a balance between adhesive and cohesive forces. Wetting and adherence of liquid films to surfaces are important in many significant commercial applications. Lubrication of parts is often based on the formation of a liquid film between parts that effectively separates the parts, decreasing part wear and reducing power losses due to friction. Printing applications often rely on providing a precise wetting of a drum or other surface with an ink. Biological and medical systems can require uniform surface wetting in applications ranging from culture dishes and substrates to fluidic components for drug delivery. For applications such as these and others, materials are generally selected that are wettable by the liquid of interest. In some cases, this limits the available selection of materials. In other examples, specialized surface treatments are used to, for example, render a hydrophobic surface hydrophilic. In other cases, surface wetting is highly dependent on surface chemistry, and accordingly sensitive to surface contamination and surface treatment such as cleaning. Alternative approaches are needed that can reduce wetting dependence on surface chemistry.

SUMMARY

The disclosure pertains to patterning surfaces to promote liquid adhesion, and particularly to increase surface wetting. By providing patterns with features having suitable protrusions or indentations with selected heights or depths, respectively, as well as periods, wetting of a variety of surfaces can be enhanced. In some examples, surfaces that are typically considered to be hydrophobic are wetted. This structured wetting can be used in lubrication, printing, precise liquid dispensation, and other applications. The foregoing and other features and advantages of the disclosed technology will become more apparent from the following detailed description, which proceeds with reference to the accompanying figures.

BRIEF DESCRIPTION OF THE DRAWINGS

FIG. 1 illustrates a representative structured wettable surface that includes a plurality of parallel linear features.

FIG. 1A is a representative sectional view of the structured wettable surface of FIG. 1.

FIG. 1B illustrates wetting of the structured wettable surface of FIGS. 1-1A.

FIGS. 2A-2B illustrate structured wettable surfaces provided on a surface of a sphere.

FIG. 3 illustrates a container having a structured wettable bottom surface.

FIG. 14C illustrates water holding for the pattern features of FIG. 14A after exposure to a buffered oxide etch (BOE) followed by hexamethyldisilazane (HMDS) coating and baking.

FIGS. 21-22 illustrate a cooler that includes a grooved substrate that retains a fluid.

DETAILED DESCRIPTION

Figure 4:
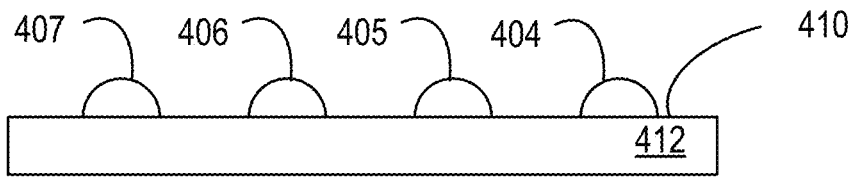
FIG. 4 illustrates a representative structured wettable surface formed by a plurality of periodically spaced ridges defined on a substrate.

The disclosure pertains generally to providing surface structures that establish uniform liquid films on a surface. Such structures can permit uniform films to be formed at surfaces that would be otherwise incompatible with liquid film formation. In some disclosed examples, grooves or other surface indentations are used to produce a wettable surface, while in others, surface ridges that protrude from a surface are used. For convenient description these features are referred to herein as "wetting features." In some examples, combinations of ridges and grooves are used. Grooves and/or ridges can have square, rectangular, or other cross-sections based on polygons, on curved cross-sections defined by portions of circles, ellipses, ovoids or other curves, or combinations thereof. In some examples, surfaces have alternating ridges and troughs that can be defined by sinusoidal or other periodic or aperiodic curves. Wetting features typically extend along an axis that can be curved or linear, or combination of curved and linear segments. For example, wetting features can extend along an axis that is defined by a plurality of line segments or a plurality of arc segments. Wetting features are generally locally parallel. As used herein, wetting features are referred to as locally parallel if adjacent features in a neighborhood extend in directions that are parallel with 20, 10, 5, 1, or 0.1 degrees. If an axis that is perpendicular to a wetting feature intersects an adjacent wetting feature at an angle that is within 20, 15, 10, 5, 1, or 0.1 degrees of being perpendicular, the wetting features are referred to as parallel. In some examples, at locations in which axes change direction, wetting features may not be parallel, but remain generally parallel outside of these transition regions. Wetting structures generally are continuous over the area of interest. Gaps between such structures are less than 50, 25, 10, 5, or 2 times a surface indentation or ridge or other surface wetting feature.

Surface structures as disclosed herein can be periodic, aperiodic, superpositions of multiple periods, randomly periodic, or have other uniform or varying spatial frequencies. Similarly, surface structures can be non-uniform in height, width, or depth and can have variable cross-sections associated with different shapes such as discussed above.

Surface indentations can have depths between 1 nm and 100 µm, 10 nm and 10 µm, 20 nm and 5 µm, 50 nm and 2.5 µm, 100 nm and 2 µm, 200 nm and 1 µm, or other ranges. Surface indentation spacings can range from between 1 nm and 100 µm, 10 nm and 10 µm, 20 nm and 5 µm, 50 nm and 2.5 µm, 100 nm and 2 µm, 200 nm and 1 µm, or other ranges. In some examples, surface indentation separations are between 0.1, 0.5, 1.0, 2, 5, 10, 50, or 100 times the surface indentation depth. Surface indentations can be associated with spatial frequencies ranging from 0.1/m to 1000/µm. Periodic surface indentations can have indented areas and undented areas having the same width or different widths. Typically, a ratio of indented to unindented width is between 0.01 and 100. In some examples, indentation widths are between 0.2 nm and 1 µm, 0.2 nm and 2 µm, 1 nm and 5 µm, 50 nm and 10 µm, or other ranges.

In other examples, surface ridges are used and can have heights between 1 nm and 100 µm, 10 nm and 10 µm, 20 nm and 5 µm, 50 nm and 2.5 µm, 100 nm and 2 µm, 200 nm and 1 µm, or other ranges. Surface ridge spacings can range from between 1 nm and 100 µm, 10 nm and 10 µm, 20 nm and 5 µm, 50 nm and 2.5 µm, 100 nm and 2 µm, 200 nm and 1 µm, or other ranges. In some examples, surface ridge separations are between 0.1, 0.5, 1.0, 2, 5, 10, 50, or 100 times the surface ridge height. Surface ridges can be associated with spatial frequencies ranging from 0.1/m to 1000/µm. Periodic surface ridges can have raised areas and unraised areas having the same width or different widths. Typically, a ratio of ridge to unridged width is between 0.01 and 100. In some examples, ridge widths are between 0.2 nm and 1 µm, 0.2 nm and 2 µm, 1 nm and 5 µm, 50 nm and 10 µm, or other ranges.

While most examples pertain to enhancing wetting, in some examples, surfaces are provided with features that promote wetting as discussed above as well as features that impair wetting. Features that impair wetting typically have widths greater than about 0.5 mm and can be defined proximate wetting-enhancing features. Wetting structures can define captured liquid film thicknesses, and superior results may be obtained if feature heights and/or depths are less that the captured filing thickness.

In some examples, wetting structures are formed on a common surface and include both surface indentations and surface ridges as disclosed above. Surface indentions can be formed in a surface layer provided on a substrate or in the substrate. Surface ridges can be formed by depositing additional material on a substrate surface, by processing a substrate to remove portions or molding a surface to define ridges. While substrates are generally shown in the drawings having plane surfaces on which structured wettable surface features are defined, the plane surfaces are shown for convenient illustration. Non-planar surfaces can also be used such as spherical, spheroidal, cylindrical, polyhedral, or others. For example, in some lubrication applications of the disclosed surfaces, a surface of a spherical or cylindrical bearing is provided with a wettable structure or in some printing applications, a cylindrical surface is provided with such structures.

The wettable structures can overcome liquid aversion to a particular surface so that in some examples, a surface that in generally not wetted by liquid is wetted in view of the surface structures. In some examples, hydrophobic surfaces are provided with wettable surface structures facilitating wetting with polar liquid such as water, thus rendering hydrophobic surfaces hydrophilic. Such structure-based wetting can be advantageous as a surface can be microscopically hydrophobic and resistant to bind or attachment of material or organisms. Representative materials include glass, polycarbonate, polyethylene, polyethylene terephthalate, polyvinyl chloride, polypropylene, polylactic acid, acetal, nylon, acrylonitrile butadiene styrene, and metals such as, for example, steel and titanium.

Generally polar liquids such as water, ethyl alcohol, methyl alcohol, DMSO, and acetone provide superior wetting when used with the disclosed wettable structures. In lubrication examples, polar lubricants can be used.

Surface indentations can be formed by embossing, laser etching, chemical etching, plasma etching, electrical discharge machining, electron or ion beam assisted etching, molding, other processes and surface indentation patterns can be specified by direct writing, photopatterning using a pattern mask, a pattern master or mold, lift-off processes using an inverse pattern and other processes.

As discussed above, in some examples, surface features (ridges) are formed on a substrate. Ridges can be produced by depositing a suitable layer and using any of the above etching or machining processes. Layers can be applied by sputtering, evaporation, chemical vapor deposition, spin coating, using a doctor blade, and additive manufacturing processes such as printing.

The disclosed examples typically describe planar substrates and ridges or grooves that are aligned with respect to a major surface of a substrate, but surface features can be defined on cylinders, spheres, cones, polyhedral, or other 3-dimensional shapes. For plate or wafer-like substrates, the term "major surface" is used to refer to large area surfaces as distinguished from perimeter surfaces having areas defined by perimeter length and substrate thickness.

Example 1

Referring to FIGS. 1-1A, a representative device 100 having a structured wettable surface includes a plurality of ridges such as ridge 104 situated on a major surface 106 of a substrate 102. The ridges can be formed by etching and/or lift off processing a layer deposited on the major surface 106 or by other processes. As shown in FIG. 1B, upon exposure to a liquid, a trapped liquid layer 110 is formed in spaces between the ridges and a free liquid layer 112 is defined on the trapped liquid layer 110. The substrate 102 and the ridges are formed of a hydrophobic material and the liquid layers can be water layers. Typical ridge gaps are between 0.1 and 1.0 m and ridge spacings are between 0.5 m and 20 m.

Example 2

Referring to FIG. 2A, a spherical substrate 200 includes a plurality of surface indentations such as representative indentation 202 separated by unindented portions 204 both of which extend around the spherical substrate about an axis 208. FIG. 2B illustrates another spherical substrate 250 having a surface 252 that is provided with circular ridges about an axis through a pole 256 of the sphere. As shown, a cap region 254 does not include ridges.

The examples of FIGS. 2A-2B show ridges or grooves that are formed at a spherical surface in a manner corresponding to latitudes so that the ridges or grooves are parallel. In other examples, ridges or grooves are formed as longitudes and intersect at poles of the sphere.

Example 3

Referring to FIG. 3, a representative container 300 such as a culture dish includes an interior surface 301, typically a bottom surface, having an area 302 that is provided with a structured wettable coating. The area 302 can extend over a small portion of the interior surface 301 or substantially the entire bottom surface.

Example 4

Referring to FIG. 4, a representative structured wettable device 400 includes a plurality of ridges 404-407 situated on a major surface 410 of a substrate 412. The substrate 412 and the ridges 404-407 can be made or the same or different materials with materials generally selected from those that are unwettable by a liquid of choice, absent the ridges 404-407. The ridges 404-407 can extend along the major surface 410 along straight lines, curves, arcs, or geometric shapes such as polygons, ovals, circles, and ellipses. In FIG. 4, the substrate 412 and the major surface 410 are flat, but either or both can have other shapes.

Example 5

Figure 5:
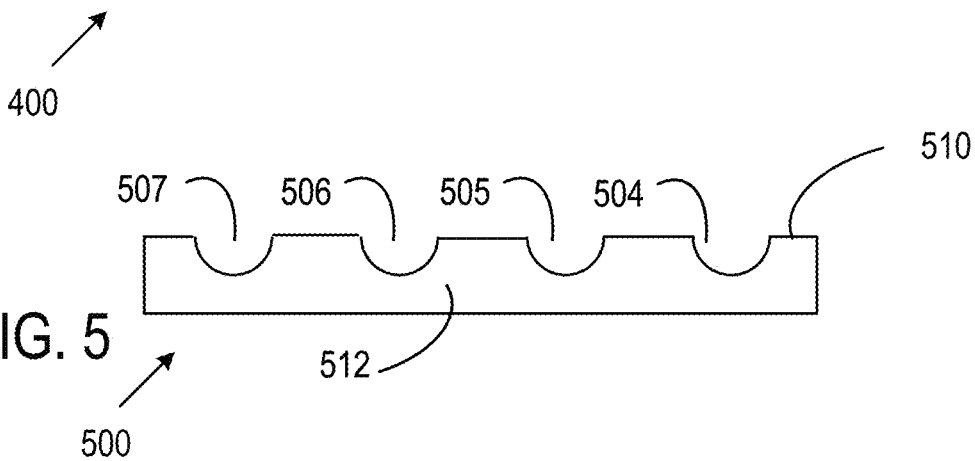
FIG. 5 illustrates a representative structured wettable surface formed by a plurality of depressions defined in a substrate.

Referring to FIG. 5, a representative structured wettable device 500 includes a plurality of grooves 504-507 situated on a major surface 510 of a substrate 512. The substrate 512 can be made or with a material that is typically unwettable by a liquid of choice, absent the grooves 504-507. The grooves 504-507 can extend along the major surface 510 along straight lines, curves, arcs, or geometric shapes such as polygons, ovals, circles, and ellipses. In FIG. 5, the substrate 510 and the major surface 510 are flat, but either or both can have other shapes.

Example 6

Figure 6:
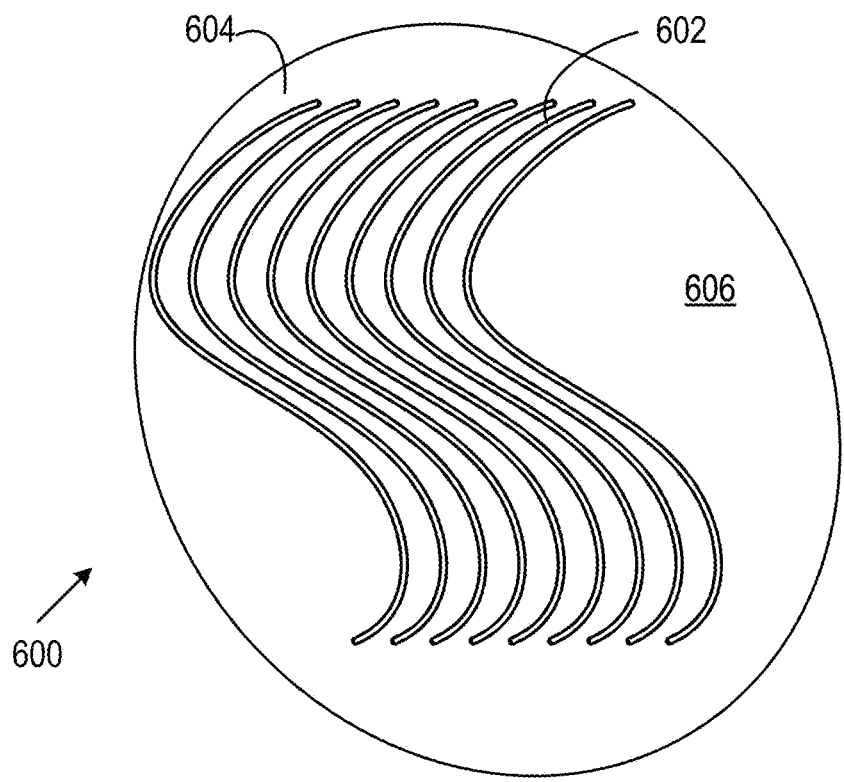
FIG. 6 illustrates a representative structured wettable surface formed by a plurality of curved depressions or grooves defined in a substrate.

Referring to FIG. 6, a representative structured wettable device 600 includes a plurality of grooves (or ridges) 602 situated on a major surface 606 of a substrate 604. The substrate 604 can be made or with a material that is typically unwettable by a liquid of choice, absent the grooves 602. In FIG. 6, the substrate 604 and the major surface 606 are flat, but either or both can have other shapes. The grooves 602 have a variable spacing but remain approximately parallel.

Example 7

Figure 7:
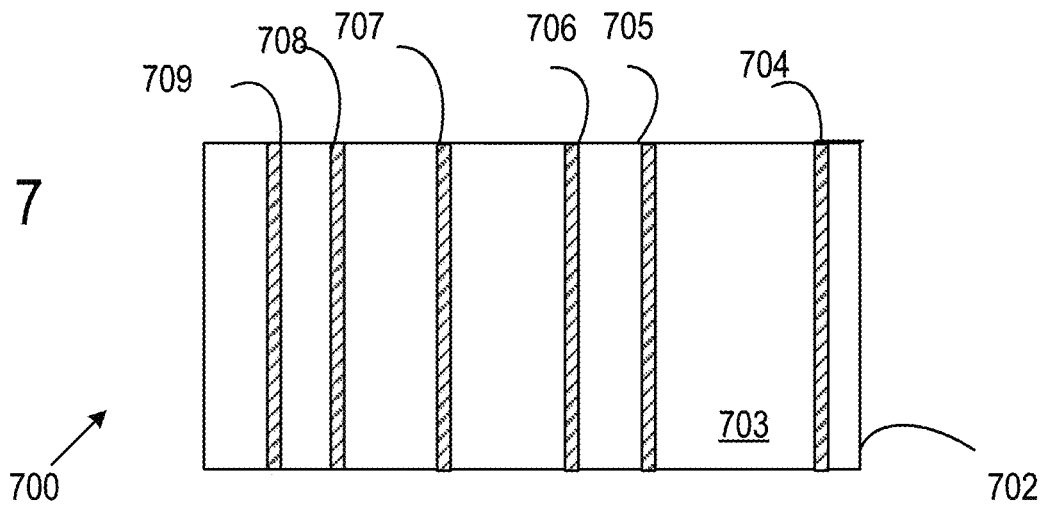
FIG. 7 illustrates a representative structured wettable surface formed by a plurality of aperiodically spaced features defined on a substrate.

Referring to FIG. 7, a representative structured wettable device 700 includes a plurality of grooves (or ridges) 704-709 situated on a major surface 703 of a substrate 702. The substrate 702 can be made with a material that is typically unwettable by a liquid of choice, absent the grooves 704-709. In FIG. 7, the substrate 704 and the major surface 703 are flat, but either or both can have other shapes. The grooves 704-709 are parallel and have a variable spacing.

Example 8

Figure 8:
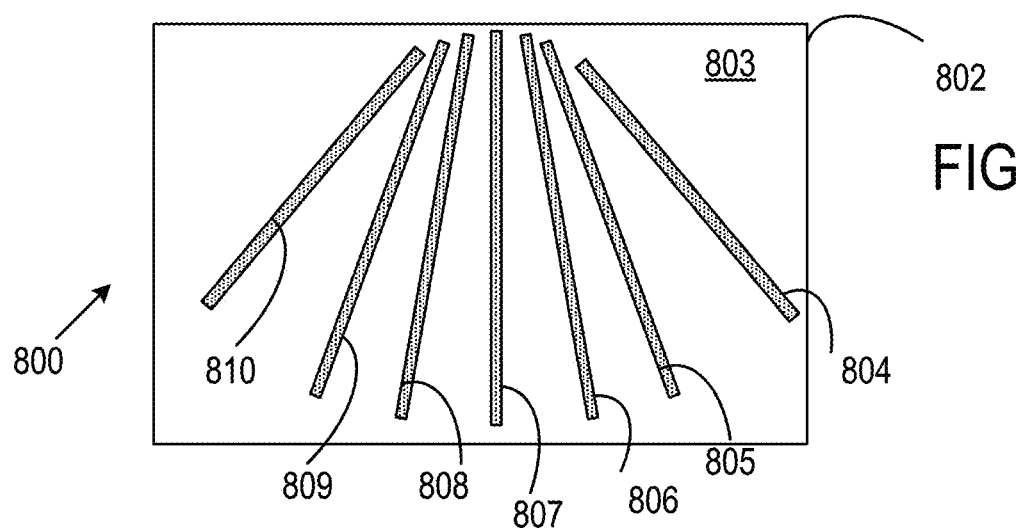
FIG. 8 illustrates a representative structured wettable surface formed by a plurality of non-parallel features defined on a substrate.

Referring to FIG. 8, a representative structured wettable device 800 includes a plurality of grooves (or ridges) 804-810 situated on a major surface 803 of a substrate 802. The substrate 802 (and the ridges) can be made with a material that is typically unwettable by a liquid of choice, absent the grooves 804-810. In FIG. 8, the substrate 802 and the major surface 803 are flat, but either or both can have other shapes. The grooves 804-810 are tilted with respect to each other but have tilt angles and separations maintained in the ranges set forth above.

Example 9

Figure 9:
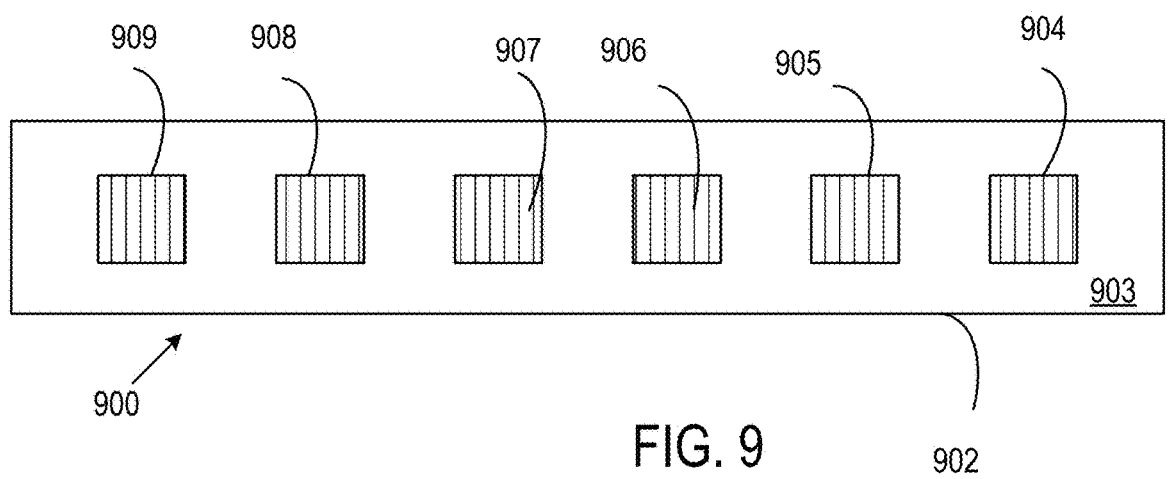
FIG. 9 illustrates a substrate on which a plurality of structured wettable areas are formed.

Referring to FIG. 9, a representative structured wettable device 900 includes a plurality of grooved (or ridged) wettable areas 904-909 situated on a major surface 903 of a substrate 902. The substrate 902 (and the ridges) can be made with a material that is typically unwettable by a liquid of choice, absent the grooves or ridges. The example of FIG. 9 provides a plurality of separated wettable areas and can be used as a test strip permitting different liquid-based tests to be carried out in each of the areas 904-909 with either different test samples or different sensitizations of the areas 904-909.

Example 10

Figure 10:
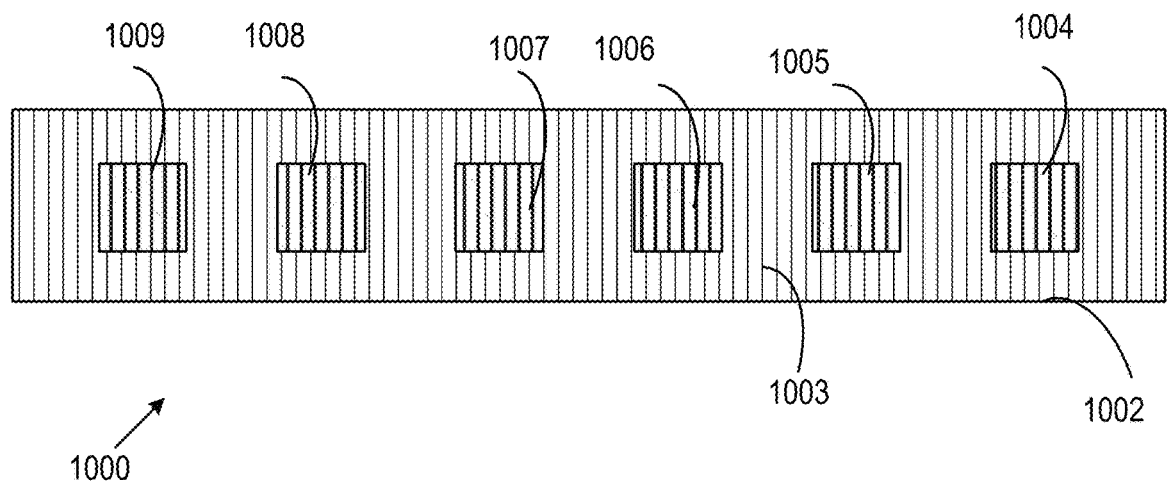
FIG. 10 illustrates a substrate on which a plurality of structured wettable areas are formed and are space apart by structured unwettable areas.

Referring to FIG. 10, a representative structured wettable device 1000 includes a plurality of grooved (or ridged) wettable areas 1004-1009 situated on a major surface 1003 of a substrate 1002. The substrate 1002 (and the ridges) can be made with a material that is typically unwettable by a liquid of choice, absent the grooves or ridges. In the example of FIG. 10, remaining areas of the major surface 1003 can be provided with a coating that resists wetting or grooves or ridges that resist wetting to further isolate each of the structured wettable areas 1004-1009 which can be helpful in test strip applications. In some examples, the major surface 1003 is unwettable in view of the choice of material for the substrate 1002.

Example 11

Figure 11:
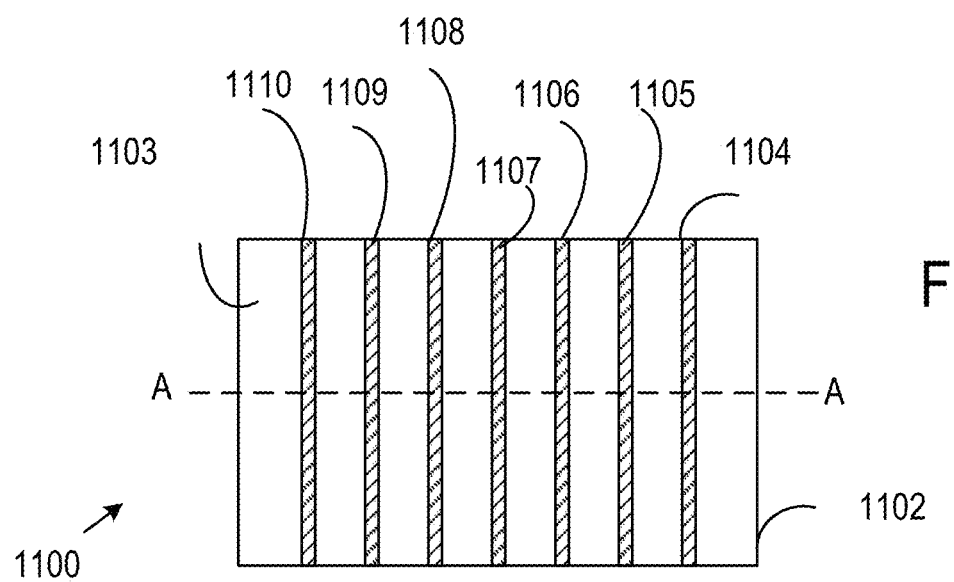
FIG. 11 illustrates a structured wettable surface defined with a plurality of inlaid portions.
Figure 11A:
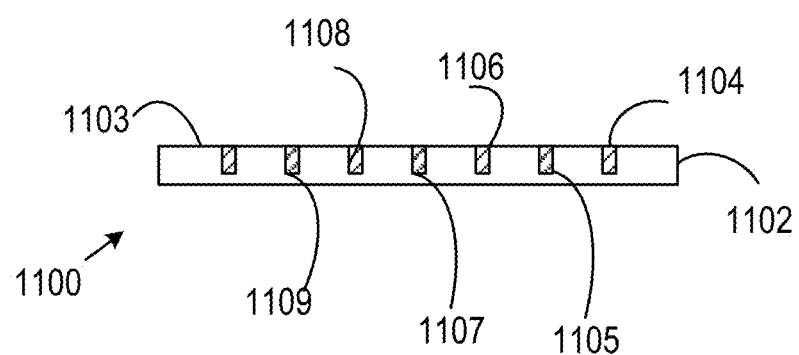
FIG. 11A is section view of the structured wettable surface of FIG. 11.

Referring to FIGS. 11-11A, a representative structured wettable device 1100 includes a plurality of inserts 1104-1110 situated on a major surface 1103 of a substrate 1102. The substrate 1102 and the inserts can be made with materials that are typically unwettable by a liquid of choice, absent the inserts.

Example 12

Figure 12:
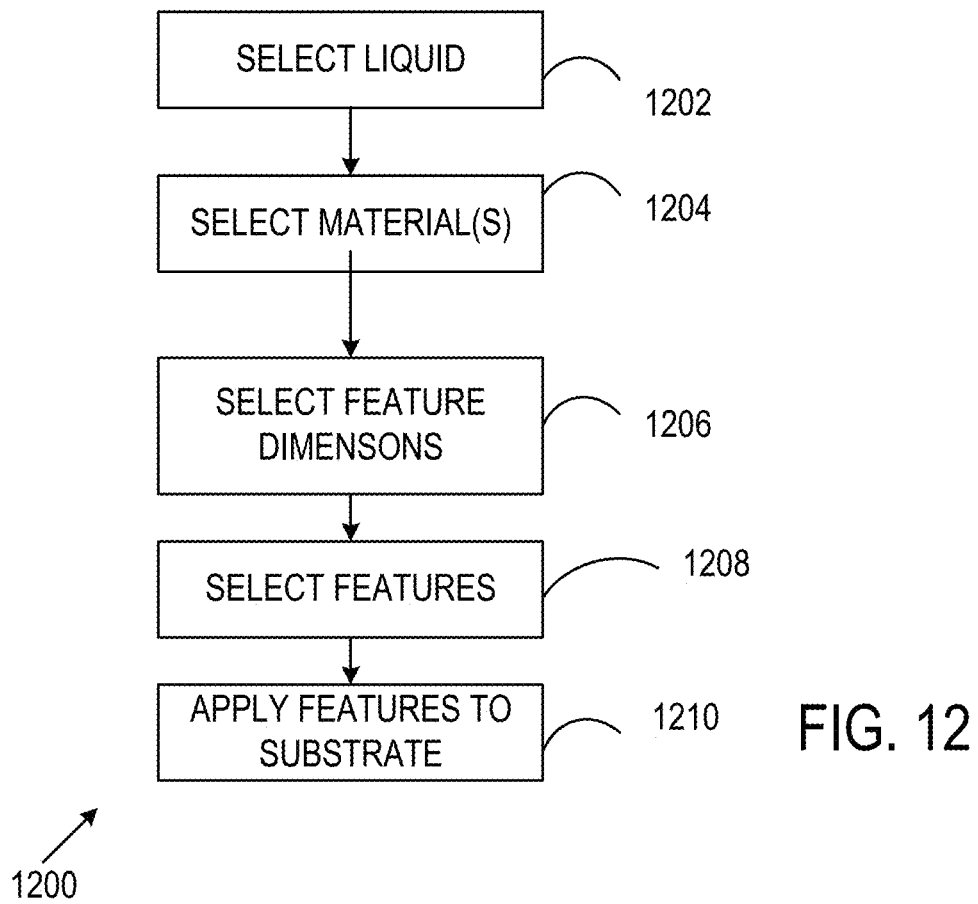
FIG. 12 illustrates a representative method of making a structured wettable surface.

Referring to FIG. 12, a representative method 1200 includes selecting a liquid for a particular application at 1202. At 1204, one or more materials are selected for use as substrates or structural features such as ridges and grooves. At 1206, feature dimensions are selected, and at 1208, particular features such as grooves, ridges, channels, or other surface indentations or protrusions are selected for use in defining a structured wettable area. At 1210, areas of a substrate are patterned according to the selected dimensions and the selected features to produce a structure wettable area on the substrate.

Example 13

Figure 13:
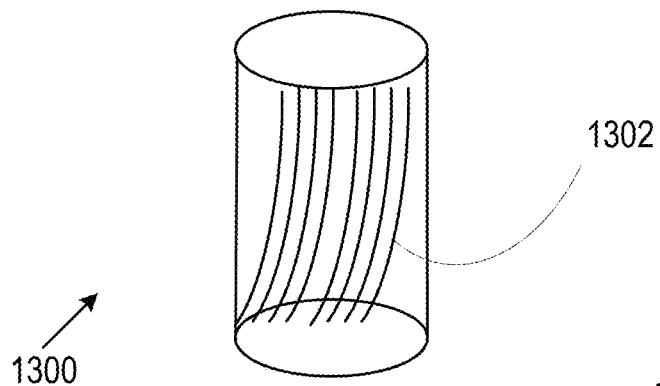
FIG. 13 illustrates a cylinder on which a structured wettable surface is defined.

Referring to FIG. 13, a cylindrical substrate 1300 has an exterior surface at which a structured wettable surface 1302 is defined. Such a substrate can be a filament of a material suitable for use in a brush, such as a paint brush. A plurality of such filaments can be used in a brush and in view of the structured wettable surface, such a brush can retain paint effectively and can similarly be readily cleaned. The filaments can be hydrophobic in the absence of the wettable structure but become hydrophilic and thus are suitable for paints based on polar liquids such as water. Other examples include drums for use in printing.

Example 14

The disclosed structured wettable surfaces can be used in a variety of applications that require the ability to uniformly spread a liquid on a substrate, including writing with an ink pen and conventional type-set printing. Using the disclosed structured wettable surfaces, a fountain pen nib or the ball bearing of a ball-point pen can be provided with such a structure to aid in retaining a uniform film of ink. Similarly, the face of type can be provided with such structures to retain a uniform film of ink. Improved consistency in ink application and the use of inks with a greater array of chemical properties is possible because chemical attraction to the ink applicator-nib, ball bearing, or typeface—is largely independent of the polarity of the ink and is dependent primarily on the wettable structure. In addition, because the topology of the substrate controls wetting, hydrophobic materials (e.g., plastics) can be used, offering potential advantages in cost and flexibility in manufacturing.

This same logic regarding structures to produce a uniform film of ink also applies for any liquid-based surface coating (e.g., water-based or other polar paints). The structured wettable surface provides an exact depth of coating, subject to specific combinations of patterning, substrate, and coating liquid properties, and avoids variability or difficulties associated with many existing surface-application or painting procedures. Similarly, the production of various organic materials including beneficial microbes, tissue cultures, and cell lines, require an aqueous substrate. With patterned surfaces this substrate can be reliably produced at a precise depth without the need for any preparation other than flowing a solution over the surface. These surfaces, depending on the materials, could be reused, re-sterilized, and offer a potential labor saving or automation.

In other examples, uniform liquid surfaces are provided on substrates for improved lubrication where parts are in potential contact. A ball-and-socket joint with nano-grooving on ball and socket could support a lubricating film consistently across the entirety of the joint. Similarly, maintaining a lubricating film on parts in motion could be improved because lubricated wettable structures can be resistant to wear.

In further examples, nano-grooving can be used in forming bristles for brushes or similar paint applicators and such brushes would ensure more even paint distribution on individual bristles, more even application of bristle to a surface being painted, and, with bristles made of a non-polar substance, ease in cleaning. Similarly, applicators such as conical spray nozzles with internal nano-grooving could achieve better flow at the interface between surface and flowing liquids and could also have improved cleaning characteristics where the nozzle materials are non-polar compared to polar or non-polar application liquids.

Many microelectronic components require liquid cooling. A cooling system exploiting the nanogrooves described here would benefit from uniformity in the liquid cooling film and potential benefits in efficiency of cooling. Nanomanufacturing fabrication processes at micro- and nanoscales require uniformity in substrates or foundation used in manufacturing. For example, cell growth or crystal growth may be influenced by topological irregularities in a substrate which are avoided on liquid films as can be produced through nano-grooving.

In other examples, liquid coatings (such as paint) of surfaces to an exact depth could be produced. Aqueous substrates of exact depth could be provided for the production of beneficial microbes, tissue cultures, and cell lines.

Example 15

Surprisingly, grooving of hydrophobic materials seems to permit flow despite a lack of or low water attraction to the hydrophobic substrate. Movement of water in microgrooves can prevent water films from being stable. Providing additional grooves at 90 degrees to the microgrooves can provide stabilization. These additional grooves intersect the microgrooves and can be orders of magnitude larger in spacing and in physical dimensions such as width and depth as compared to the microgrooves. For example, for microgrooves having a period P and amplitude A, stabilizing grooves having a period $P_S$ and an amplitude $A_S$ can be provided at an angle θ that differs from an axis perpendicular to a microgroove axis (in some cases, a local microgroove axis) by less than 15 degrees, 10 degrees, 5 degrees, 2 degrees, 1 degree, 0.5 degree, or 0.1 degree, wherein $P_S$ is greater than 2P, 5P, 10P, 20P, 100P or more. As can be greater than, less than, or nearly equal to A. For example, A can be greater than 2 A, 5 A, 10 A, 20 A or more, or less than 0.1 A, 0.5 A, or 1.0 A.

Example 16

Typically, structural features associated with water adhesion involve a combination of groove geometry, groove depth, and groove width. In representative examples, superior performance is obtained with grooves having groove sides at angles less than or equal to 1, 2, 5, 10, 15, 20, 30, or 40 degrees from vertical (i.e., from a perpendicular to a substrate surface), groove depths of between 0.5 m and 25 μm, 1.0 m and 25 μm, 1.0 m and 5 μm, or 1 μm and 2 μm. Superior results can be obtained in a range of 1.5 μm to 1.8 μm. Widths less than 10, 5, 2, 1 or 0.5 am tend to produce superior results. In one example, a groove depth of 0.8 μm and a groove width of no more than 0.5 μm can be used.

Example 17

Surfaces that are hydrophobic or somewhat hydrophobic can be patterned to hold water when such surfaces would not when unpatterned. Generally, an aspect ratio of the patterned surfaces correlates with the ability of a surface to hold water. There is an upper limit to surface hydrophobicity that can hold water even when patterned. Suitable materials for structure wetting generally have contact angles less than 75, 80, 85, 90, or 95 degrees. A quantity of liquid retained by a suitably patterned surface can be proportional to a total surface area patterned and is not necessarily dependent on pattern feature sizes.

Example 18

The table below lists several examples of water holding surfaces having various contact angles ($\alpha_{contact}$) and patterns. Surfaces used for the results in the table include some or all of the following: (1) etched trenches in Si, (2) HF etched surfaces using a Buffered Oxide Etch (BOE); (3) etched trenches in Si, coated with hexamethyldisilazane (HMDS) via vapor phase deposition; (4) rectangular structures (such as grooves) transferred to PDMS by casting; (5) rectangular structures transferred to PDMS and then $O_2$ plasma treated; (6) pyramidal structures transferred to PDMS; and (7) pyramidal structures transferred to PDMS and then $O_2$ plasma treated.

Water Holding of Example Patterned Surfaces

| Material | $\alpha_{contact}$ (deg.) | Comments | Result |
|---|---|---|---|
| $O_2$ plasma cleaned silicon | <5 | Atmospheric oxygen plasma activation of silicon (100) surfaces | All etch depths and surfaces (including flat surfaces) hold water at all angles |
| Plasma-treated PDMS | ~10-40 | Effect of oxygen plasma surface treatment | Water held on most patterned surfaces. |
| HMDS coated silicon | ~70 | | Water holding capacity depends on aspect ratio |
| H-terminated silicon | ~83 | Water adsorption on surface of silicon aged under different environmental conditions | Water holding capacity a function of aspect ratio |
| Native PDMS | ~105 | Oxygen plasma treatment of polydimethylsiloxane surface (PDMS), effect on capillary flow in microchannels | No surfaces held water |

Example 19

The disclosed patterned surfaces can also provide precise, accurate dispensing of liquid volumes, particularly small volumes. Unlike pipetting or other conventional approaches, a suitably grooved (patterned) surface may not need calibration or recalibration as the water volume held is specified upon patterning. Such patterned surface could provide measured dosed in many applications. For instance, in a self-injector with multiple doses, rather than complex mechanical measuring mechanisms, material could just be shaken over a grooved "dose" surface, excess drained into a reservoir, and the exact necessary dose delivered by use of a piston pushing the dose off the grooves. In other examples, grooving could be formed on tubes so that exposure to water provides a water-lubricated tube that can be cleaned and disinfected for reuse. Because the grooved surface holds a constant size of water droplet (under a given temperature and pressure), it provides a non-mechanical mechanism for measuring water volume. This feature would allow the mechanization of measuring techniques that currently require human or robotic measurements, it provides a permanent solution, and it does not require repeated recalibrations. This combination of properties offers potential in many applications including medicine, field diagnostics, and chemical production, to name a few.

Example 20

Figures 14A, 14B:
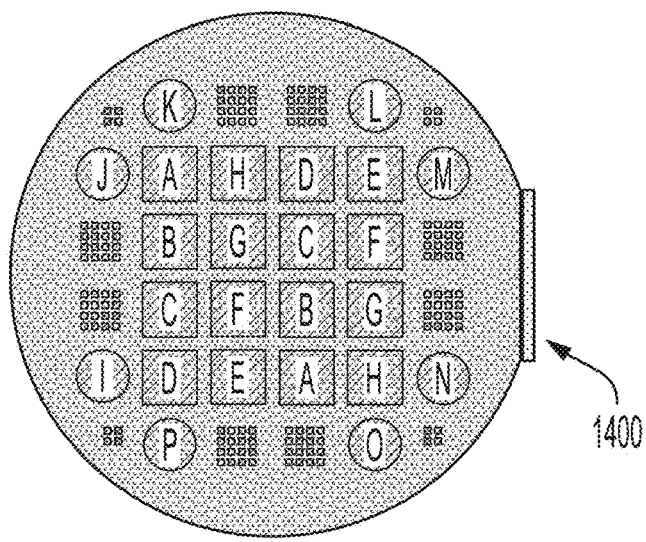
FIG. 14A illustrates a substrate having a plurality of patterned areas.
FIG. 14B illustrates water holding for the pattern features of FIG. 14A after exposure to a buffered oxide etch (BOE).
Figure 15A:
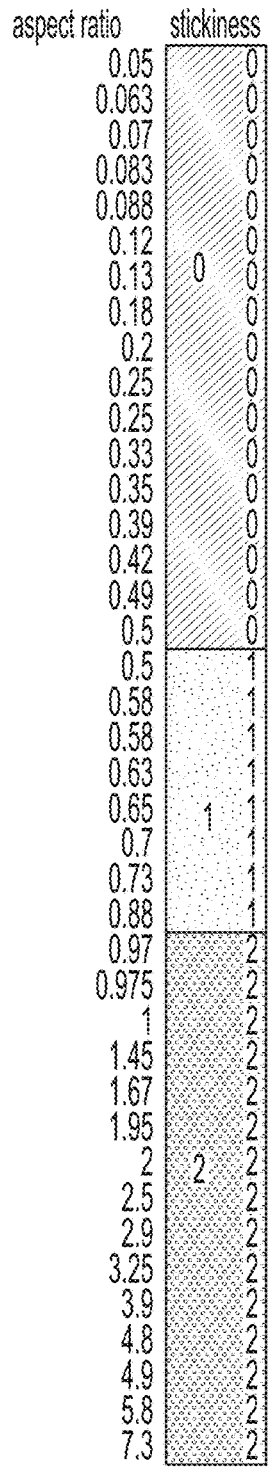
FIGS. 15A-15D illustrate water retention properties of pattern areas such as shown in FIG. 14A after exposure to a buffered oxide etch (BOE) (FIGS. 15A, 15C) and after HMDS coating and baking (FIGS. 15B, 15D).
Figure 15B:
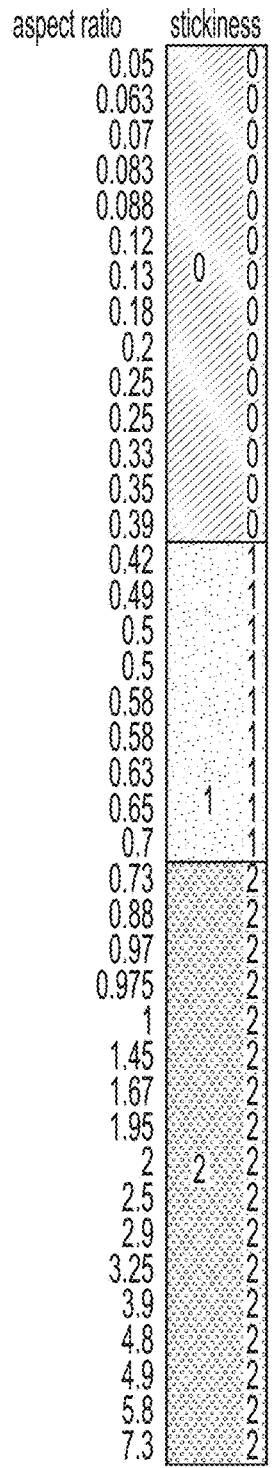
Figure 15C:
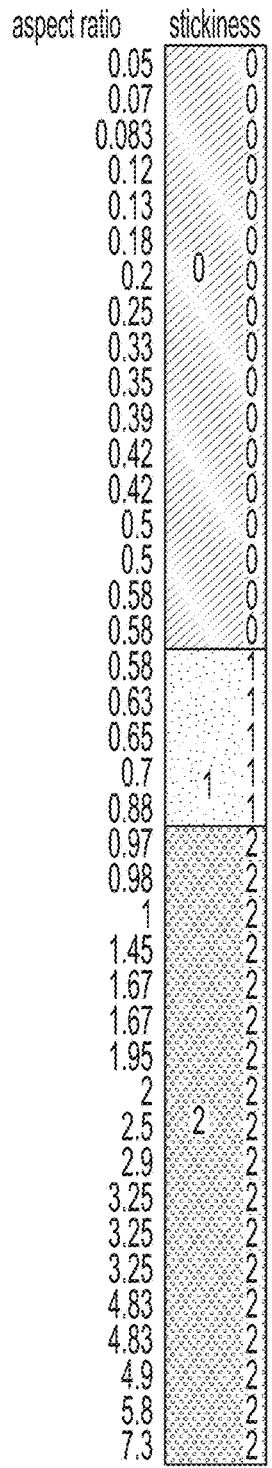
Figure 15D:
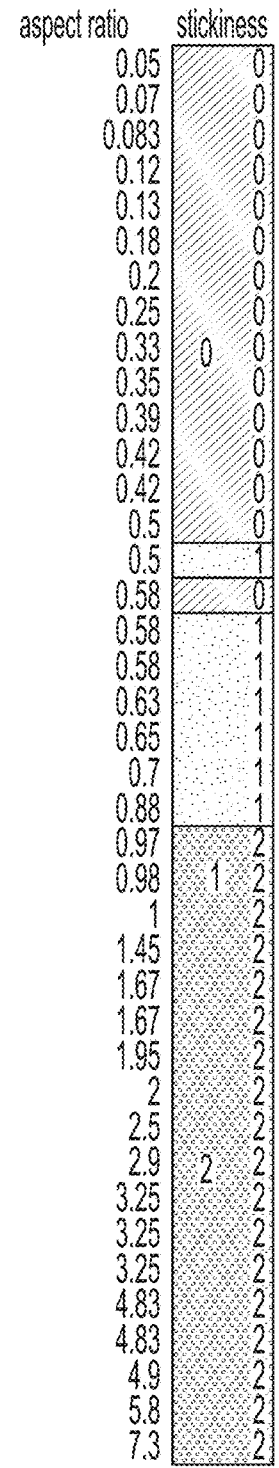

FIG. 14A illustrates a silicon wafer 1400 on which a plurality of square or circular test areas are defined. Each of the test areas is labeled A, B, . . . , or P indicating pattern width (i.e., period), ranging from 0.8 m to 10 μm and etch depths up to about 6 m. An array of areas having the indicated patterning is defined in each of these test areas. The wafer 1400 is exposed to a buffered oxide etchant (BOE) producing etch depths and stickiness as a function of etch depth in the test areas as shown in FIG. 14B. The wafer 1400 is then coated with hexamethyldisilazane (HDMS) and baked, and the resulting stickiness as a function of etch depth is illustrated in FIG. 14C. "Stickiness" is defined as a combination of surface coverage and resistance to gravity and ranked as 0, 1, or 2 as indicated by shading in FIGS. 14B-14C. Stickiness of 0=no water holding, 1=partial coverage of surface and resistance to gravity to 90 degrees, and 2=complete coverage of surface and resistance to gravity to 180 degrees (upside down). Stickiness as a function of aspect ratio is shown for square areas (such as area A) and circular areas (such as area K) of the wafer 1400 processed by a BOE etch (FIGS. 15A, 15C) and then followed by HDMS coating and baking (FIGS. 15B, 15D). Stickiness is indicated by shading as in FIGS. 14B-14C. As is apparent, stickiness is generally larger for larger aspect ratios.

Figure 16:
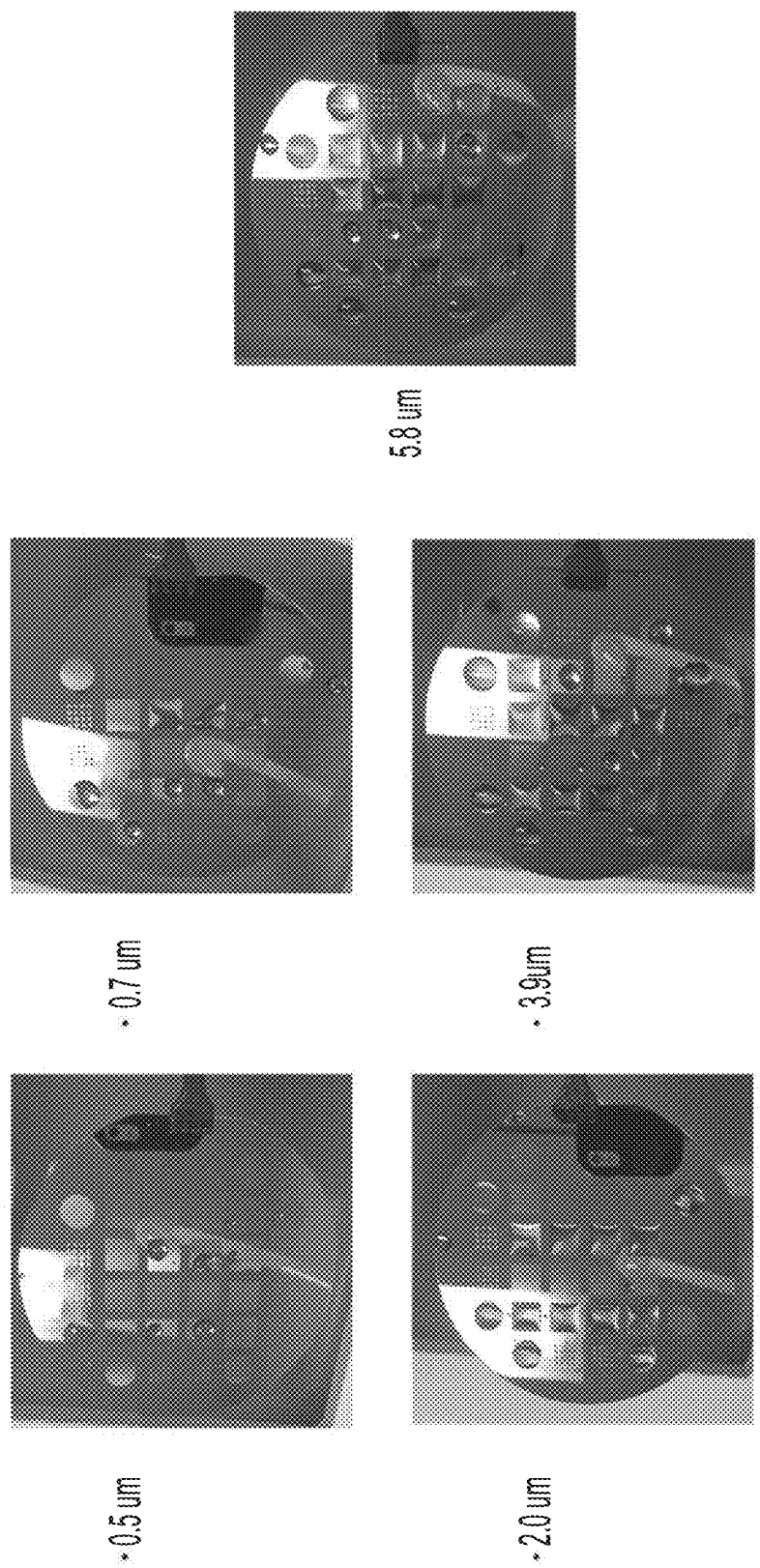
FIG. 16 includes images for various HF-etched silicon surfaces with groove depths of 0.5, 0.7, 2.0, 3.9, and 5.8 m.
Figure 17:
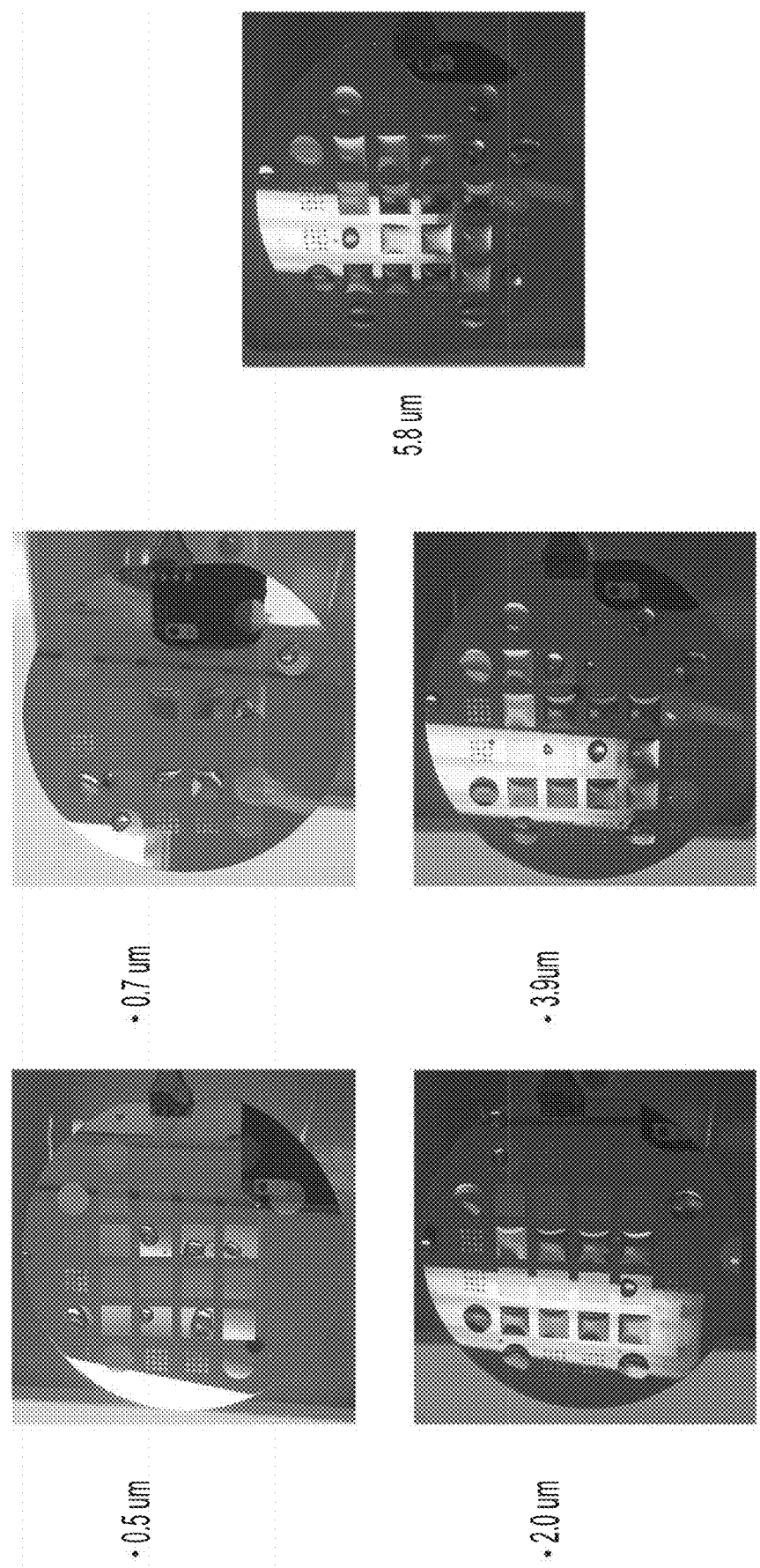
FIG. 17 includes images for various HDMS-coated silicon surfaces with groove depths of 0.5, 0.7, 2.0, 3.9, and 5.8 m.

FIG. 16 includes images for various HF-etched silicon surfaces with groove depths of 0.5, 0.7, 2.0, 3.9, and 5.8 m. FIG. 17 includes images for various HDMS-coated silicon surfaces with groove depths of 0.5, 0.7, 2.0, 3.9, and 5.8 m. The images of FIG. 16 and FIG. 17 show consistency of water holding by various groove depths.

Example 21

Figure 18:
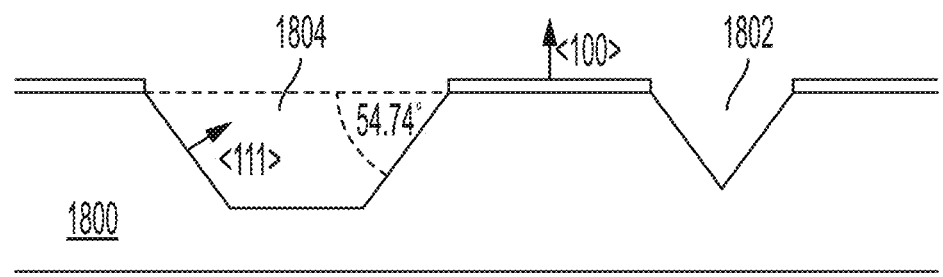
FIG. 18 illustrates a representative etched surface that can be used to form protrusions in a cast layer.

Trenches in PDMS can be formed as follows. Holes can be etched in silicon and the silicon is coated with a release agent. Liquid PDMS is cast over the etched holes. The PDMS is peeled from the silicon, leaving protrusions corresponding to the etched holes. Referring to FIG. 18, wet etch is used to formed angled trenches such as trench 1804 on a silicon substrate 1800 that can be used to form flat-topped pyramidal protrusions. Alternatively, a trench 1802 having a triangular cross-section can be formed and used to form pyramidal protrusions without the flat top. In representative examples, 1 µm and 4 µm um wet-etched Si holes were used to make pyramidal protrusions in a PDMS layer. The heights of the pyramids were set by the angle of the wet etch, so that the "aspect ratio" is constant with a 54.7 deg sidewall angle as shown in FIG. 18.

Example 22

Figure 19:
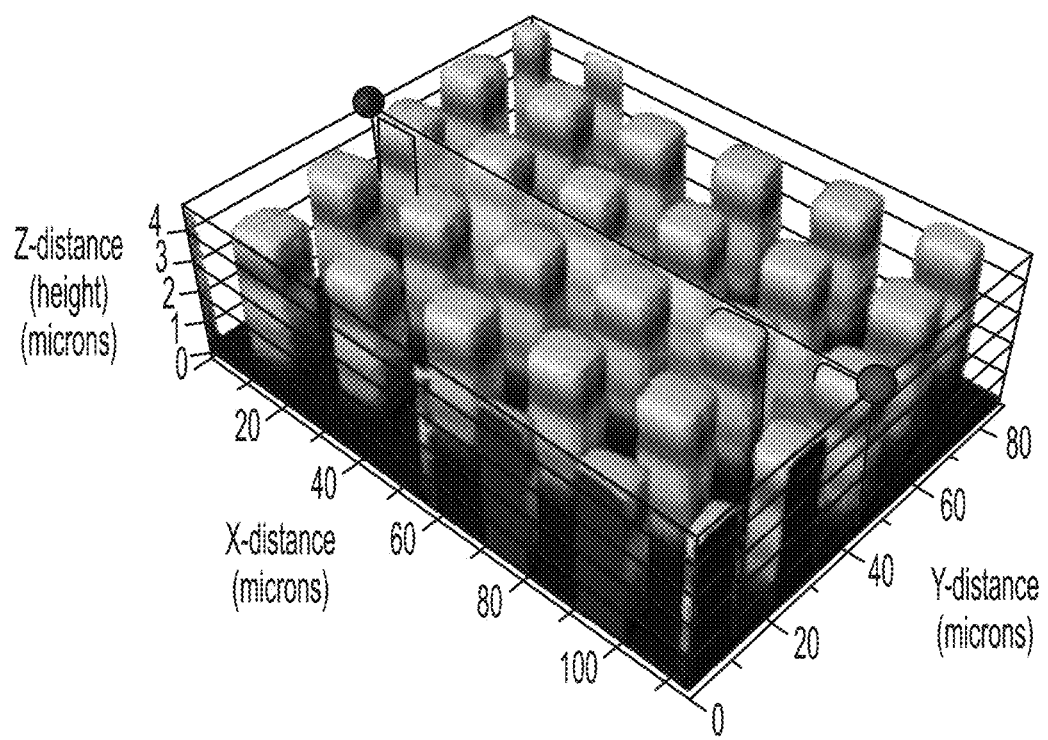
FIG. 19 shows results of profiling a representative trenched PDMS surface obtained using an optical profilometer.

In some examples, trenches are formed. FIG. 19 illustrates a profile of a representative trenched PDMS surface obtained with an optical profilometer.

Example 23

Figure 20A:
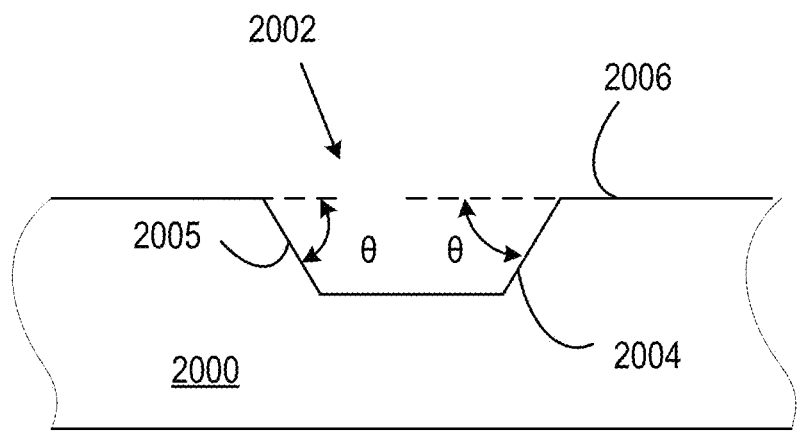
FIGS. 20A-20B illustrate representative grooves.
Figure 20B:
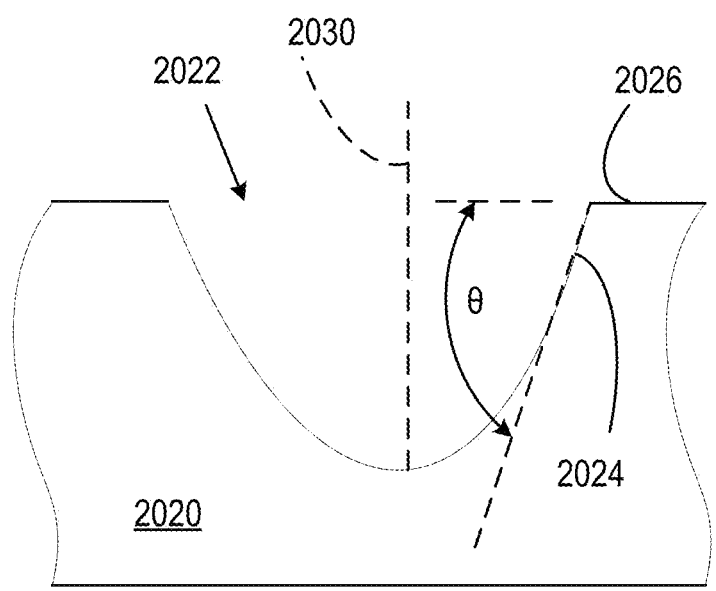

FIGS. 20A-20B illustrate representative grooves 2002, 2022. The groove 2002 is defined in substrate 2000 and has sidewalls 2004, 2005 that are at an angle θ with respect to a non-grooved surface 2006. The angle θ is preferably between 50 and 90 degrees for superior fluid retention, but angles greater than 90 degrees can be used. Specific angles can depend on a substrate/fluid combination. The sidewalls 2004, 2005 are associated with the same angle θ but need not be. The groove 2020 is defined in substrate 2020 and defines a groove surface 2024 that has portions that are at an angle θ with respect to a non-grooved surface 2026 proximate the non-grooved surface. The angle θ is preferably between 50 and 90 degrees for superior fluid retention, but angles greater than 90 degrees can be used. Specific angles can depend on a substrate/fluid combination. The groove 2022 is symmetric about an axis 2030 but asymmetric shapes can be used. Grooves can include planar or curved surface portions as convenient.

Example 24

Referring to FIGS. 21-22, a representative cooler 2100 includes a substrate 2102 on which one or more grooves are defined such as representative groove 2104. The grooves are fluidically coupled via a capillary chamber 2108 to a capillary tube 2106 that can supply liquid to the grooves via capillary action. As shown in FIG. 2, an electrical component, system, other device 2110 can be thermally coupled to the substrate 2108 so that evaporation of liquid in the grooves cools the device 2110. Evaporated liquid is replenished with liquid provided by the capillary tube 2106. If desired, the evaporated liquid can be captured by situating the grooves in an enclosure so that the liquid can be reused.

Example 25

Figure 23:
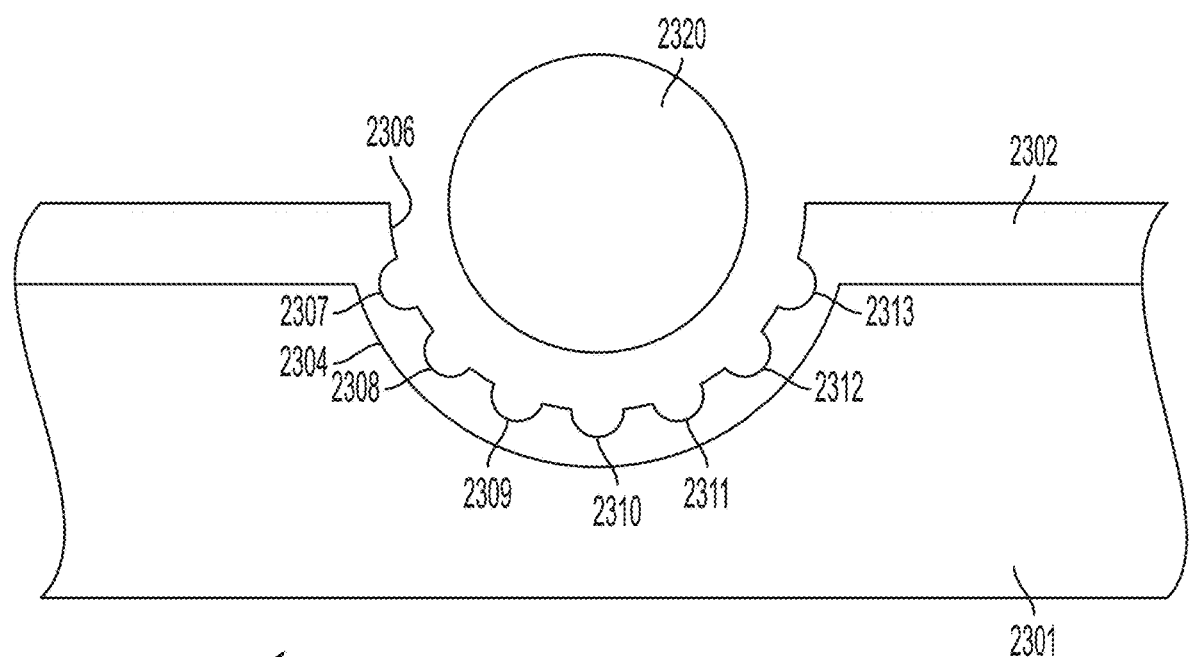
FIG. 23 illustrates a representative bearing.

Referring to FIG. 23, a representative bearing 2300 includes a base 2301 that defines a recessed surface 2304 sized for at least partial insertion of a roller member 2320 such as a spherical ball or a cylindrical section. While the recessed surface 2304 can be provided with grooves for lubricant retention, in this example an insert 2302 is provided with grooves 2304-2313 for a lubricant. The insert 2302 can be manufactured by forming a grooved area in a foil or other thin substrate and then shaping the substrate so that the grooved area conforms to the recessed surface 2304. For example, the insert 2302 can be placed on the substrate 2301 and the grooved area pressed toward the recessed surface 2304. In this way, groove formation can be done on a planar substrate if convenient and neither the roller member 2320 nor the recessed surface 2304 (both of which are curved) need be provided with grooves.

REPRESENTATIVE EMBODIMENTS

Embodiment 1 is a substrate, including: a surface formed by a non-wetting material; and a wettable structure formed at the surface.

Embodiment 2 includes the subject matter of Embodiment 1, and further specifies that the wettable structure comprises one or more of: a plurality of grooves; a plurality of ridges; a plurality of indentations; and a plurality of protrusions.

Embodiment 3 includes the subject matter of any of Embodiments 1-2, and further specifies that the wettable structure comprises a plurality of periodic grooves.

Embodiment 4 includes the subject matter of any of Embodiments 1-3, and further includes a non-wetting surface portion.

Embodiment 5 includes the subject matter of any of Embodiments 1-4, and further includes a surface layer situated on a surface of the substrate, wherein at least one of the non-wetting surface portion and the wetting structure are defined by the surface layer.

Embodiment 6 includes the subject matter of any of Embodiments 1-5, and further includes a surface layer situated on a surface of the substrate, wherein the non-wetting surface portion and the wettable structure are defined by the surface layer.

Embodiment 7 includes the subject matter of any of Embodiments 1-6, and further specifies that the wettable structure comprises a plurality of groves, wherein the grooves are between 1 m and 1 nm deep and have separations between 1 nm and 2 km.

Embodiment 8 includes the subject matter of any of Embodiments 1-7, and further specifies that the grooves are between 1 nm and 2 µm wide.

Embodiment 9 includes the subject matter of any of Embodiments 1-8, and further specifies that the groove width is at least as large as the groove depth.

Embodiment 10 includes the subject matter of any of Embodiments 1-9, and further specifies that the groove width is at least the groove depth.

Embodiment 11 includes the subject matter of any of Embodiments 1-10, and further specifies that the grooves have rectangular, triangular, or hemispherical cross sections.

Embodiment 12 includes the subject matter of any of Embodiments 1-11, further comprise a liquid layer situated at the surface, the liquid layer including a trapped layer situated within the wettable structure and a free layer situated on the trapped layer.

Embodiment 13 includes the subject matter of any of Embodiments 1-12, and further specifies that the surface is a biosurface, a bearing surface, a hull of ship, or a print drum.

Embodiment 14 includes the subject matter of any of Embodiments 1-13, and further specifies that the surface is a hydrophobic surface.

Embodiment 15 is a brush, including a plurality of elongated strands of a hydrophobic material, each strand having an exterior surface defining a structured wettable surface.

Embodiment 16 includes the subject matter of Embodiment 15, and further specifies that the structured wettable surface comprises a plurality of grooves have a separation of between 10 nm and 2 km.

Embodiment 17 is a printing device, including: an ink transfer member; and a structured wettable structure at a surface of the ink transfer member, wherein the structure wettable structure comprises a plurality of groove or ridges having separations between 10 nm and 2 µm and is operable to retain ink at the surface.

Embodiment 18 includes the subject matter of Embodiment 17, and further includes an ink layer situated at the surface, wherein the wettable structure is defined in a hydrophobic material and the ink layer includes a polar solvent.

Embodiment 19 is a method, including: providing a bearing surface with a wettable structure; and retaining a lubricant at the bearing surface with the wettable structure.

Embodiment 20 includes the subject matter of Embodiment 19, and further specifies that the bearing surface is a surface of a hydrophobic material, and wherein the lubricant includes a polar solvent.

Embodiment 21 includes the subject matter of any of Embodiments 19-20, and further specifies that the bearing surface comprises a surface of a ball and a surface of a corresponding socket, wherein at least one of the surface of the ball and the surface of the socket is provided with the wettable structure.

Embodiment 22 is a cooler, including: a substrate having a structured wettable surface that is operable to retain a liquid and a thermal transfer surface; a capillary coupled to provide the liquid to the structured wettable surface; and a container coupled to provide the liquid to the capillary.

Embodiment 23 is a bearing, including: a roller member; a support surface having a recess configured to receive the roller member; and an insert situated at a surface of the recess, wherein the insert had a structured wettable surface and the roller member is situated against the structured wettable surface.

General Considerations

As used herein, hemiwicking refers to the retention of a liquid by surface pattern features. Hemiwicking or liquid holding surfaces as disclosed herein generally have features such as grooves with the following characteristics: a) feature spacing in a range of 0.001 to 10 µm, b) feature widths of less than 0.5 µm, and c) feature depths/heights of 0.5 µm or greater. For example, liquid films can be established on a surface of a stainless steel substrate with grooves of less than 6 µm spacing, groove width of 0.5 µm, and groove depth of 0.5 µm or more. Hemiwicking occurs across variable groove geometries, with groove side angles in a range of 60-90 degrees. For convenient description, grooved surfaces are used in some examples, but other structured, wettable surfaces can be used.

A liquid volume held in a surface groove is consistent subject to the properties of the liquid and the area of grooving. At larger sizes (dependent on liquid and surface properties, temperature, and orientation), liquid holding is limited by weight of the liquid. Liquid application methods can influence the degree to which repeatable volumes of liquid can be held on a given surface. With submersion and removal of a grooved surface, the volume of liquid retained is influenced by angle and speed of removal of the grooved surface from the liquid. With liquid application by droplets or pouring, a volume of retained liquid is influenced by volume, speed, and angle of application of the liquid to the grooved surface.

In addition to liquid holding under static conditions, dynamic liquid holding can be achieved by combining grooved patterning connected to larger grooved structures that allow liquid flow by capillary action. Connecting grooved, hemiwicking surfaces to liquid reservoirs by capillary "tunnels" permits evaporative loss of retained liquids with replenishment as is desirable for cooling. Liquids and liquid volumes held through grooving depend upon polarities of the liquid and substrate. Polar additives to non-polar liquids (e.g., to oils and similar hydrocarbons) allow for superior liquid holding of such non-polar liquids by grooved surfaces.

The disclosed surfaces are suitable for various applications in microfludics in which small fluid volumes are used in, for example, multiplexing, automation, and high-throughput screening. Other examples include inkjet printheads, DNA chips, lab-on-a-chip technology, micro-propulsion, and micro-thermal technologies. Some such microfluidic apparatus can be implemented as micro-pneumatic systems, processing both fluids both on and off-chip fluids with fluid volumes of a few nanoliters or picoliters. (liquid pumps, gas valves, etc.), and microfluidic structures for the on-chip handling of nanoliter (nl) and picoliter (pl) volumes. The disclosed surfaces can be used to retain and/or measure liquid volumes for polymerase chain reactions or other testing such as medical or environmental testing. The disclosed approaches can be implemented using plastic, metallic, or other substrates.

In view of the many possible embodiments to which the principles of the disclosed technology may be applied, it should be recognized that the illustrated embodiments are only preferred examples and should not be taken as limiting the scope of the disclosure.

We claim:

1. A substrate, comprising:
a surface formed by a non-wetting material; and
a wettable structure formed at the surface, wherein the wettable structure comprises a plurality of grooves, wherein the grooves are between 1 µm and 1 nm deep and have separations between 1 nm and 2 µm.

2. The substrate of claim 1, wherein the grooves of the plurality of grooves are periodic.

3. The substrate of claim 1, wherein the wettable structure covers a portion of the surface of the non-wetting material leaving a non-wetting surface portion exposed.

4. The substrate of claim 3, further comprising a surface layer situated on a surface of the substrate, wherein at least one of the non-wetting surface portion and the wetting structure are defined by the surface layer.

5. The substrate of claim 3, further comprising a surface layer situated on a surface of the substrate, wherein the non-wetting surface portion and the wettable structure are defined by the surface layer.

6. The substrate of claim 1, wherein the grooves are between 1 nm and 2 µm wide.

7. The substrate of claim 6, wherein a groove width is at least as large as a groove depth.

8. The substrate of claim 1, wherein a groove width is at least a groove depth.

9. The substrate of claim 1, wherein the grooves have rectangular, triangular, or hemispherical cross sections.

10. A substrate, comprising:
a surface formed by a non-wetting material;
a wettable structure formed at the surface; and
a liquid layer situated at the surface, the liquid layer including a trapped layer situated within the wettable structure and a free layer situated on the trapped layer.

11. The substrate of claim 1, wherein the surface is a biosurface, a bearing surface, a hull of ship, or a print drum.

12. The substrate of claim 1, wherein the surface is a hydrophobic surface.

13. The substrate of claim 1, wherein the grooves have separations of between 10 nm and 2 μm.

14. A printing device, comprising:
an ink transfer member; and
a substrate, comprising:
a surface formed by a non-wetting material; and
a wettable structure formed at the surface, wherein the wettable structure comprises a plurality of grooves, wherein the grooves are between 1 μm and 1 nm deep and have separations between 1 nm and 2 μm, wherein the substrate is situated at a surface of the ink transfer member and is operable to retain ink at the surface.

15. The printing device of claim 14, further comprising an ink layer situated at the surface, wherein the wettable structure is defined in a hydrophobic material and the ink layer includes a polar solvent.

16. A method, comprising:
providing a substrate having:
a surface formed by a non-wetting material, and
a wettable structure formed at the surface and defining a bearing surface, wherein the wettable structure comprises a plurality of grooves, wherein the grooves are between 1 μm and 1 nm deep and have separations between 1 nm and 2 μm; and
retaining a lubricant at the bearing surface with the wettable structure.

17. The method of claim 16, wherein the bearing surface is a surface of a hydrophobic material, and wherein the lubricant includes a polar solvent.

18. The method of claim 16, wherein the bearing surface comprises a surface of a ball and a surface of a corresponding socket, wherein at least one of the surface of the ball and the surface of the socket is provided with the wettable structure.

19. A cooler, comprising:
a substrate having:
a surface formed by a non-wetting material;
a wettable surface that is operable to retain a liquid, wherein the surface is formed by a non-wetting material, and a wettable structure formed at the surface, wherein the wettable structure comprises a plurality of grooves, wherein the grooves are between 1 μm and 1 nm deep and have separations between 1 nm and 2 μm, and
a thermal transfer surface;
a capillary coupled to provide the liquid to the wettable surface; and
a container coupled to provide the liquid to the capillary.

20. A bearing, comprising:
a roller member;
a support surface having a recess configured to receive the roller member; and
a substrate situated at a surface of the recess, wherein the substrate includes:
a surface formed by a non-wetting material; and
a wettable structure formed at the surface, wherein the wettable structure comprises a plurality of grooves, wherein the grooves are between 1 μm and 1 nm deep and have separations between 1 nm and 2 μm and the roller member is situated against the wettable structure.

21. The substrate of claim 2, wherein a groove width is at least as large as a groove depth.

* * * * *